(12) United States Patent
Liu

(10) Patent No.: US 8,936,987 B2
(45) Date of Patent: Jan. 20, 2015

(54) PMOS TRANSISTORS AND FABRICATION METHODS THEREOF

(71) Applicant: Semiconductor Manufacturing International (Shanghai) Corporation, Shanghai (CN)

(72) Inventor: Jialei Liu, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 14/161,816

(22) Filed: Jan. 23, 2014

(65) Prior Publication Data

US 2014/0361339 A1 Dec. 11, 2014

(30) Foreign Application Priority Data

Jun. 5, 2013 (CN) .......................... 2013 1 0222207

(51) Int. Cl.
*H01L 21/336* (2006.01)
*H01L 29/78* (2006.01)
*H01L 29/66* (2006.01)

(52) U.S. Cl.
CPC ...... *H01L 29/7848* (2013.01); *H01L 29/66492* (2013.01)
USPC .......................................... 438/300; 438/299

(58) Field of Classification Search
USPC .................................................. 438/300, 299
See application file for complete search history.

(56) References Cited

U.S. PATENT DOCUMENTS

| 7,494,858 B2* | 2/2009 | Bohr et al. ..................... 438/198 |
| 7,951,657 B2* | 5/2011 | Cheng et al. ................... 438/151 |
| 8,216,906 B2* | 7/2012 | Tsai et al. ...................... 438/304 |
| 8,334,185 B2* | 12/2012 | Kronholz et al. ............. 438/303 |
| 8,441,045 B2* | 5/2013 | Zhu et al. ....................... 257/255 |
| 8,551,846 B2* | 10/2013 | Kim et al. ...................... 438/300 |
| 2007/0020861 A1* | 1/2007 | Chong et al. .................. 438/296 |
| 2008/0283906 A1* | 11/2008 | Bohr .............................. 257/327 |
| 2009/0101942 A1* | 4/2009 | Dyer .............................. 257/288 |
| 2011/0079820 A1* | 4/2011 | Lai et al. ....................... 257/190 |

* cited by examiner

Primary Examiner — Karen Kusumakar
(74) Attorney, Agent, or Firm — Anova Law Group, PLLC

(57) ABSTRACT

A method is provided for fabricating a PMOS transistor. The method includes providing a semiconductor substrate; and forming gate structures on a surface of the semiconductor substrate. The method also includes forming sidewall spacers around the gate structures; and forming a protection layer on the sidewall spacers. Further, the method includes forming sigma shape trenches in the semiconductor substrate at sides of the gate structures; and forming SiGe structures with a surface protruding from the surface of the semiconductor substrate in the sigma shape trenches. Further, the method also includes removing the sidewall spacers and a portion of the protection layer; and forming lightly doped drain regions in the semiconductor substrate at both sides of the gate structures.

20 Claims, 5 Drawing Sheets

US 8,936,987 B2

PMOS TRANSISTORS AND FABRICATION METHODS THEREOF

CROSS-REFERENCES TO RELATED APPLICATIONS

This application claims the priority of Chinese patent application No. 201310222207.9, filed on Jun. 5, 2013, the entirety of which is incorporated herein by reference.

FIELD OF THE INVENTION

The present invention generally relates to the field of semiconductor manufacturing technology and, more particularly, relates to PMOS transistors and fabrication techniques thereof.

BACKGROUND

With the increase of integration level of integrate circuits (ICs), the critical dimension (CD) of semiconductor devices has become smaller and smaller. When the CD of the semiconductor devices is continuously shrank, leak voltages of the semiconductor devices may be unable to be correspondingly decreased, thus electric fields of the channel regions between source regions and drain regions of the semiconductor devices may be significantly strong. Electrons of in semiconductor devices may be accelerated by secondary collisions to a speed that is multiple-times higher than a speed of thermal movement. The electrons with such a high speed may be referred as hot electrons. The hot electrons may cause a hot electron effect. The hot electron effect may cause the hot electrons to flow into gate dielectric layers of the semiconductor devices; and to form gate currents and substrate currents. Thus, the stability of the semiconductor devices and circuits may be affected.

In order to prevent the hot electron effect, a plurality of structures have been developed to improve structures of MOS transistors, such as dual infusion structures, embedded channel structures, discrete gate structures, lightly doped drain (LDD) structures or embedded drain structures, etc. Among of these structures, the LDD structures have attracted more research attentions, and have presented applicable possibilities. The LDD structures may reduce the electrical fields; and may significantly improve the hot electron effect.

Besides enhancing the performance of the MOS transistors by improving the hot electron effect, enhancing the performance of MOS transistors using stress has become a more and more common method because the stress may alter the band gap and carrier mobility of silicon. Carriers of NMOS transistor are electrons; and carriers of the PMOS transistors are holes. Specifically, by properly controlling the stress in channel regions of MOS transistor, the carrier mobility may be increased, so as to increase the drive current. Thus, the performance of the MOS transistors may be significantly enhanced.

For example, an embedded SiGe technology may be used to generate a compressive stress in the channel region of a PMOS transistor, the carrier mobility of the PMOS transistor may be increased. The embedded SiGe technology may refer to embedding SiGe in regions corresponding to a subsequently formed source region and a subsequently formed drain region in the semiconductor substrate. The embed SiGe may generate compressive stress to the channel region of the PMOS transistor because of the lattice mismatch between silicon and SiGe.

Theoretically, the embedded SiGe technology may increase the carrier mobility of transistors to a certain extent. However, in practical fabrication processes of the PMOS transistors, the carrier mobility of PMOS transistor may be still relatively low. Further, other devices and/or structures may be formed on a same substrate with the PMOS transistor, and a plurality of processes may be needed to etch and/or clean the substrate with the PMOS transistor, the devices and/or structures, thus the embedded SiGe may be damaged by the processes. The disclosed methods and devices are directed to solve one or more problems set forth above and other problems.

BRIEF SUMMARY OF THE DISCLOSURE

One aspect of the present disclosure includes a method for fabricating a PMOS transistor. The method includes providing a semiconductor substrate; and forming gate structures on a surface of the semiconductor substrate. The method also includes forming sidewall spacers around the gate structures; and forming a protection layer on the sidewall spacers. Further, the method includes forming sigma shape trenches in the semiconductor substrate at sides of the gate structures and forming SiGe structures with a surface protruding from the surface of the semiconductor substrate in the sigma shape trenches. Further, the method also includes removing the sidewall spacers and a portion of the protection layer; and forming lightly doped drain regions in the semiconductor substrate at both sides of the gate structures.

Another aspect of the present disclosure includes a PMOS transistor. The PMOS transistor includes a semiconductor substrate; and a gate structure formed on a surface of the semiconductor substrate. The PMOS transistor also includes SiGe structures with a surface protruding from the surface of the semiconductor substrate formed in the semiconductor substrate at both sides of the gate structure; and lightly doped drain regions formed in the semiconductor substrate at both sides of the gate structure. Further, the PMOS transistor includes a protection layer protecting side surfaces of portions of the SiGe structures protruding from the surface of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 9:
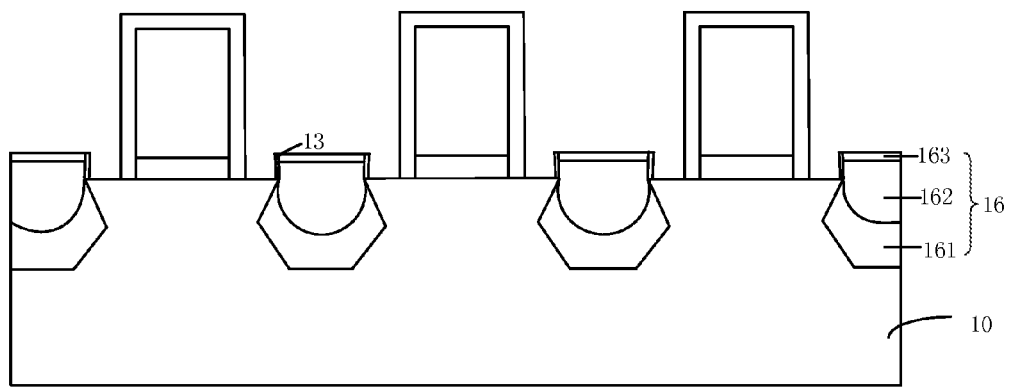
Figure 10:
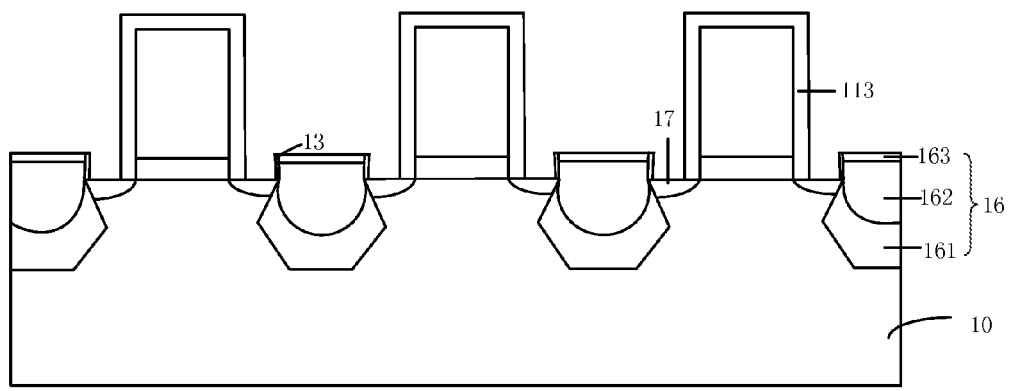
Figure 11:
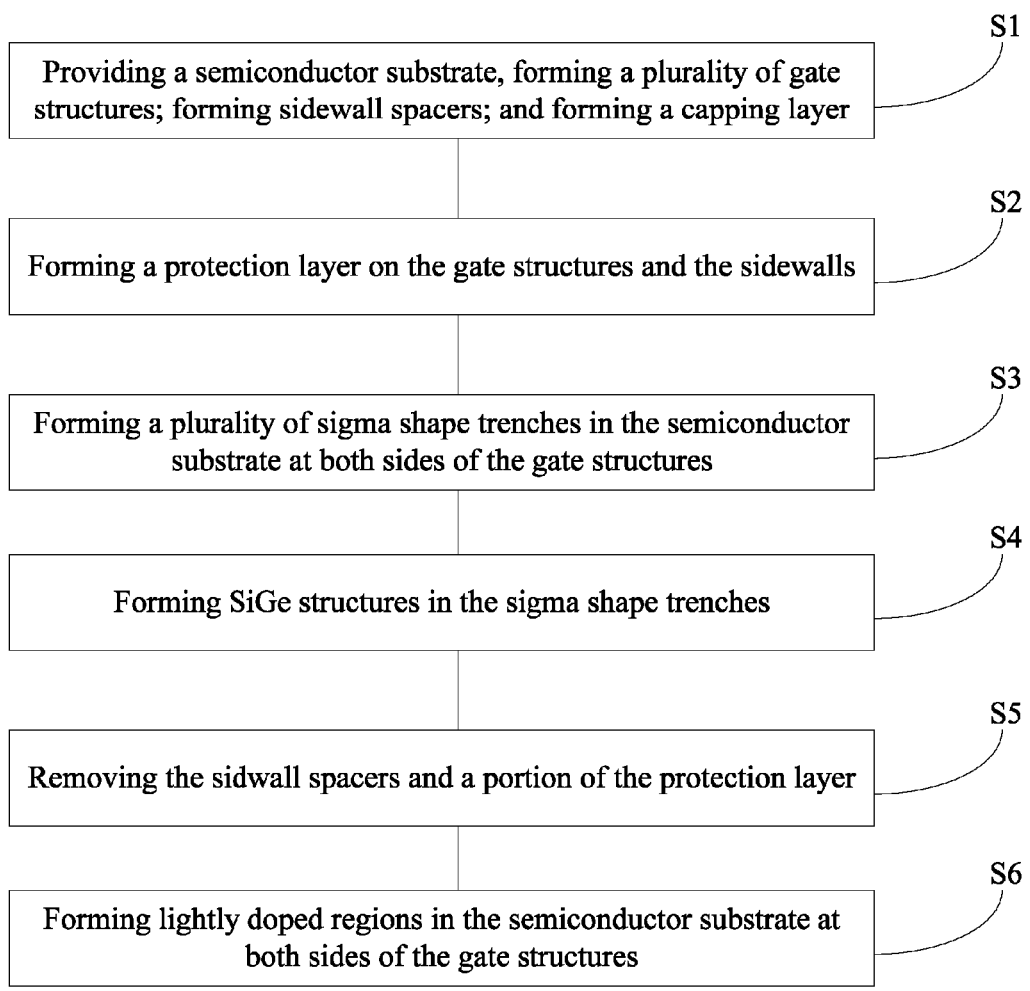
FIG. 11 illustrates an exemplary fabrication process of a PMOS transistor consistent with the disclosed embodiments.

FIG. 11 illustrates an exemplary fabrication process of a PMOS transistor consistent with the disclosed embodiments; and FIGS. 1~10 illustrate semiconductor structures corresponding to certain stages of an exemplary fabrication process of a PMOS transistor consistent with disclosed embodiments.

Figure 1:
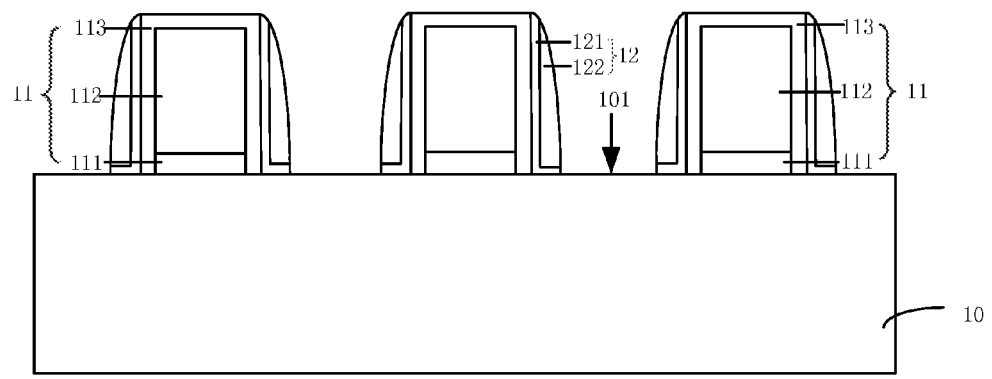
FIGS. 1~10 illustrate semiconductor structures corresponding to certain stages of an exemplary fabrication process of a PMOS transistor consistent with disclosed embodiments.

As shown in FIG. 11, at the beginning of the fabrication process, a semiconductor substrate with certain structures may be provided (S1). FIG. 1 illustrates a corresponding semiconductor structure.

As shown in FIG. 1, a semiconductor substrate 10 is provided; a plurality of the gate structures 11 may be formed on a surface 101 of the semiconductor substrate 10; a capping layer 113 may be formed on the gate structures 11; and sidewall spacers 12 are formed around the capping layer 113.

The semiconductor substrate 10 may include any appropriate semiconductor material, such as silicon, silicon on insulator (SOI), germanium on insulator (SOI), silicon germanium, carborundum, indium antimonide, lead telluride, indium arsenide, indium phosphide, gallium arsenidie, gallium antimonite, alloy semiconductor or a combination thereof. In one embodiment, the semiconductor substrate 10 is single crystal silicon. The semiconductor substrate 10 provides a base for subsequent processes and structures.

Further, a plurality of the shallow trench isolation (STI) structures (not shown) may be formed in the surface 101 of the semiconductor substrate 10. The STI structures may be used to isolate active regions in the semiconductor substrate 10.

Referring to FIG. 1, the gate structure 11 may include a gate dielectric layer 111 formed on the surface 101 of the semiconductor substrate 10; and a gate electrode layer 112 formed on the gate dielectric layer 111. A process for forming the gate structure 11 may include forming a gate dielectric material layer on the surface 101 of the semiconductor substrate 10; forming a gate electrode material layer on the gate dielectric material layer; forming a patterned photoresist layer on the gate electrode material layer; and etching the gate electrode material layer and the gate dielectric layer exposed by the patterned photoresist layer. Thus, the gate dielectric layer 111 and the gate electrode layer 112 may be formed.

The gate dielectric layer 111 may be made of any appropriate material, such as silicon oxide, silicon nitride, silicon oxynitride, or aluminum oxide, etc. In one embodiment, the gate dielectric layer 111 is made of silicon oxide.

Various processes may be used to form the gate dielectric layer 111, such as a chemical vapor deposition (CVD) process, a physical vapor deposition (PVD) process, an atomic layer deposition (ALD) process, a thermal oxidation process, or a flowable CVD (FCVD) process, etc. In one embodiment, the gate dielectric layer 111 is formed by a thermal oxidation process. A thickness of the gate dielectric layer 111 may be in a range of approximately 10 Å~20 Å.

The gate electrode layer 112 may be made of any appropriate material, such as poly silicon, Cu, Al, or W, etc. In one embodiment, the gate electrode layer 112 is made of poly silicon.

Various processes may be used to form the gate electrode layer 112, such as a CVD process, a PVD process, or an electroplating process, etc. In one embodiment, the gate electrode layer 112 is formed by a conventional thermal CVD process in a high temperature furnace. A thickness of the gate electrode layer 112 may be in a range of approximately 400 Å~1000 Å.

In a practical fabrication process of a PMOS transistor, an embedded SiGe technology may be used to generate compressive stress to a channel region of the PMOS transistor to improve a carrier mobility of the channel region. The embedded SiGe may often be formed by an epitaxial growth process. Referring to FIG. 1, in order to prevent SiGe from being formed on the gate electrode layer 112 made of poly silicon; a capping layer 113 may be formed on the gate structures 11.

That is, the capping layer 113 may cover side surfaces and top surfaces of the gate dielectric layer 111 and the gate electrode layer 112.

The capping layer 113 may be made of an electric insulation material, such as one or more of silicon oxide, silicon nitride and silicon oxynitride, etc. In one embodiment, the capping layer 113 is made of silicon nitride.

Referring to FIG. 1, the sidewall spacers 12 may be formed on side surfaces of the gate structures 11. In one embodiment, the sidewall spacers 12 are formed on the side surfaces of the capping layer 113. The sidewall spacers 12 may be a single layer, or a multiple-stacked layer made of different materials. In one embodiment, as shown in FIG. 1, the sidewall spacer 12 is a multiple-stacked layer having a first layer 121 and a second layer 122.

A process for forming the sidewall spacers 12 may include forming a uniform sidewall spacer material layer on side surfaces and top surfaces of the capping layer 113 and the surface 101 of the semiconductor substrate 10; and followed by an etch back process. Thus, a portion of the sidewall spacer material layer on the surface 101 of the semiconductor substrate 10 and the top surfaces of the capping layer 113 may be removed; and the sidewall spacers 12 may be formed. If the sidewall spacer 12 is multiple-stacked layer, two different sidewall spacer material layers may be formed; followed by the etch back process. Referring to FIG. 1, after the each back process, the bottom portion of the sidewall spacer 12 may be greater than the top portion of the sidewall spacer 12.

The sidewall spacers 12 may be made of any appropriate material, such as silicon oxide, silicon nitride, silicon oxynitride, etc. In one embodiment, referring to FIG. 1, the first layer 121 of the sidewall spacer 12 is made of silicon oxide; and the second layer 122 of the sidewall spacer 12 is made of silicon nitride. For illustrative purposes, the first layer 121 and the second layer 122 may refer to a silicon oxide layer 121 and a silicon nitride layer 122, respectively.

Figure 2:
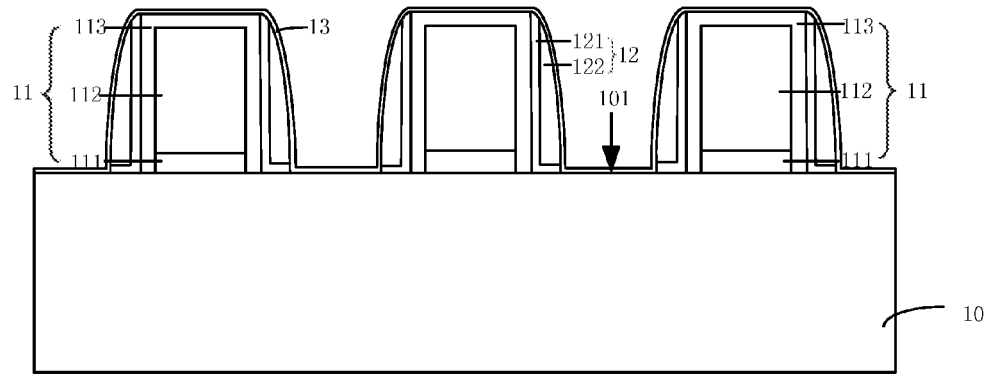

Returning to FIG. 11, after providing the semiconductor substrate 10 with the gate structures 11, a protection layer may be formed on the sidewall spacers 12 and the gate structures 11 (S2). FIG. 2 illustrates a corresponding semiconductor structure.

As shown in FIG. 2, a protection layer 13 is formed on the sidewall spacers 12 and the gate structures 11. That is, the protection layer 13 may cover the sidewall spacers 12 and the top surfaces of the capping layer 113. In a practical fabrication process, the substrate 10 may be used to form both PMOS transistors and other semiconductor devices, such as NMOS transistors, etc. Thus, when an ion implantation process is subsequently used to form lightly doped drain (LDD) regions of the PMOS transistors, the other semiconductor devices may need to be protected by a photoresist layer and other appropriate coatings.

After forming the LDD regions, the residue photoresist may need to be removed and cleaned. A solution for removing the residue photoresist may include ammonia, hydrogen peroxide, and water, etc. The solution may have a relatively fast etching speed to a subsequently formed SiGe structures. The protection layer 13 may protect the subsequently formed SiGe structures; and reduce an etching to the SiGe structures caused by the solution used for etching and cleaning the photoresist layer.

In one embodiment, a mixture solution of ammonia, hydrogen peroxide and water is used to remove the residue photoresist layer, and the protection layer 13 may be made of SiCN, or SiON, etc. A carbon concentration of SiCN may be in a range of approximately 0.5%~5%. It may be relatively easy to form SiCN; and SiCN may have a relatively good etching selectivity to the subsequently formed SiGe structures. That is, an etching rate of the mixture solution to SiCN may be substantially smaller than an etching rate of the mixture solution to the subsequently formed SiGe structures.

Figure 3:
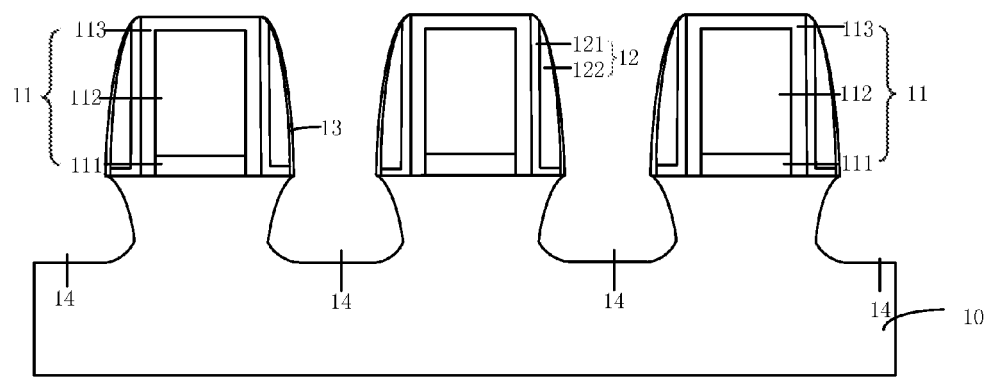
Figure 4:
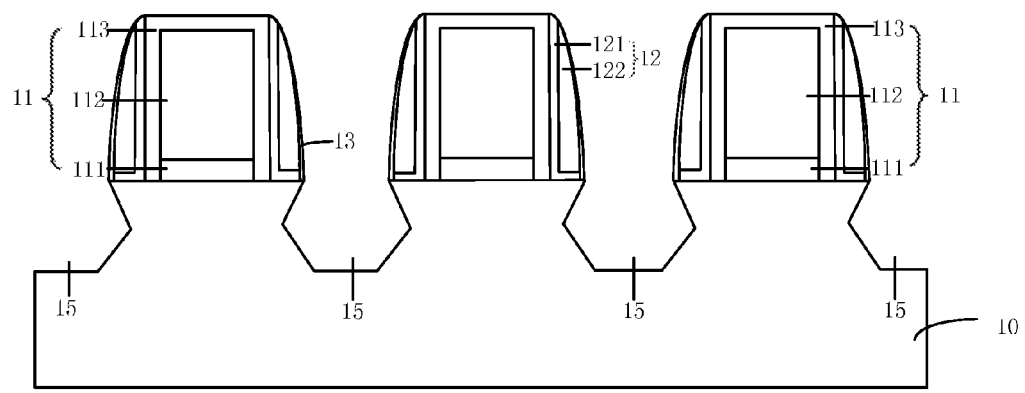

Returning to FIG. 11, after forming the protection layer 13, a plurality of sigma shape trenches may be formed in the semiconductor substrate 10 (S3). FIGS. 3~4 illustrate corresponding semiconductor structures.

As shown in FIG. 3, a plurality of bowl shape trenches 14 are formed in the semiconductor substrate 10 at both sides of the gate structures 11. After certain fabrication processes, as shown in FIG. 4, a plurality of sigma shape trenches 15 are formed from the bowl shape trenches 14. Positions of the sigma shape trenches 15 may correspond to positions of subsequently formed source regions and drain regions.

In one embodiment, a process for forming the sigma shape trenches 15 may include forming the bowl shape trenches 14 in the semiconductor substrate 10 at both sides of the gate structures 11 by etching the semiconductor substrate using the gate structures 11, the sidewall spacers 12 and the protection layer 13 as an etching mask; and etching the bowl shape trenches 14 to form the sigma shape trenches 15.

Various processes may be used to etch the semiconductor substrate 10 to form the bowl shape trenches 14, such as a dry etching process, a wet etching process, or an ion beam etching process, etc. In one embodiment, the bowl shape trenches 14 are formed by an anisotropic dry etching process; and followed by an isotropic dry etching process.

Etching gases of the anisotropic dry etching process may include $CF_4$ and $HBr$, etc. A temperature of the anisotropic dry etching process may be in a range of approximately 40° C.~60° C. A power of a plasma source of the anisotropic dry etching process may be in a range of approximately 200 W~400 W. A bias voltage of the plasma source of the anisotropic dry etching process may be in a range of approximately 50V~200V. A time of the anisotropic dry etching process may be in a range of approximately 10 s~20 s.

Etching gases of the isotropic dry etching process may include $Cl_2$ and $NF_3$, etc. A temperature of the isotropic dry etching process may be in a range of approximately 40° C.~60° C. A power of a plasma source of the isotropic dry etching process may be in a range of approximately 100 W~500 W. A bias voltage of the plasma source of the isotropic dry etching process may be in a range of approximately 0V~10V. A time of the anisotropic dry etching process may be in a range of approximately 5 s~20 s.

In one embodiment, a depth of the bowl shape trenches may be in a range of approximately 100 Å~800 Å.

Various processes may be used to etch the bowl shape trenches 14 to form the sigma shape trenches 15, such as a dry etching process, a wet etching process, or an ion beam etching process. In one embodiment, the sigma shape trenches 15 are formed by a wet etching process. An etching solution of the wet etching process may include any appropriate chemicals. In one embodiment, the etching solution of the wet etching process is a tetramethyl ammonium hydroxide (TMAH) water solution.

TMAH may have a relatively high etching speed to silicon. Further, TMAH may have a relatively good crystal orientation etching selectivity. That is, TMAH may have a restively fast etching rate along the <100> direction and the <110> direction of silicon; and may have a relatively low etching rate along other directions, such as <111> direction of silicon. Thus, the sigma shape trenches 15 may be formed by using the crystal orientation etching selectivity characteristic of TAMH to silicon.

A time of the wet etching process using TMAH may be in a range of approximately 50 s~500 s. A temperature of the wet etching process using TMAH may be in a range of approximately 20° C.~80° C. A concentration of TMAH in the etching solution may be in a range of approximately 2%~20%.

In one embodiment, a depth of the sigma shape trenches 15 may be in a range of approximately 300 Å~800 Å.

Figure 5:
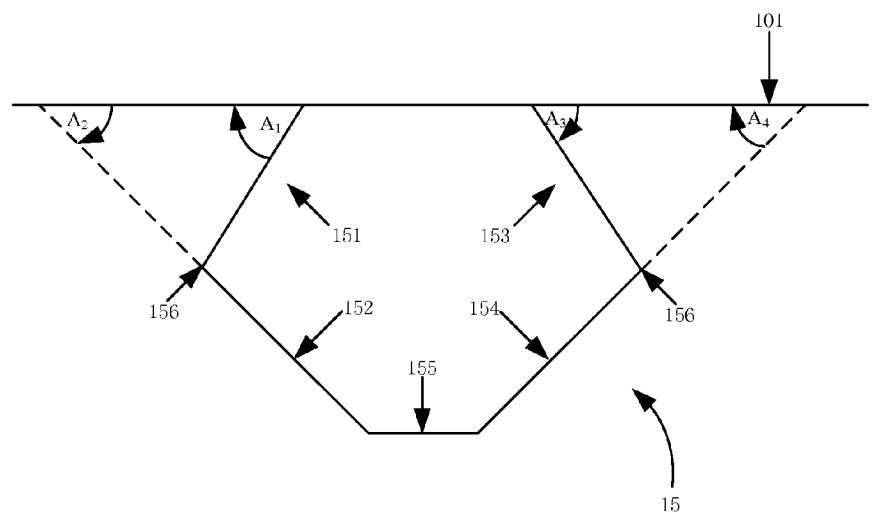

FIG. 5 is a magnified image of the sigma shape trench 15 shown in FIG. 4. As shown in FIG. 5, the sigma shape trench 15 may have a first sidewall 151, a second sidewall 152 connecting with the first sidewall 151 and a trench jut 156 formed by the first sidewall 151 and the second sidewall 152. The sigma shape trench 15 may also include a third sidewall 153, and a fourth sidewall 154 connecting with the third sidewall and a trench jut 156 formed by the third sidewall 153 and the fourth sidewall 154. Further, the sigma shape trench 15 may include a bottom surface 155 connecting with both the second sidewall 152 and the fourth sidewall 154.

According the etching characteristic of TMAH, an angle $A_1$ between the surface 101 of the semiconductor substrate 10 and the first sidewall 151 may be an acute angle; and the angle $A_1$ may be approximately 54.7°. An angle $A_2$ between the surface 101 of the semiconductor substrate 10 and the second sidewall 152 may be an acute angle; and the angle $A_2$ may be approximately 54.7°. An angle $A_3$ between the surface 101 of the semiconductor substrate 10 and the third sidewall 153 may be an acute angle; and the angle $A_3$ may be approximately 54.7°. An angle $A_4$ between the surface 101 of the semiconductor substrate 10 and the fourth sidewall 154 may be an acute angle; and the angle $A_4$ may be approximately 54.7°. A way to index the angle $A_1$, $A_2$, $A_3$ and $A_4$ may refer to FIG. 5.

Referring to FIG. 2-3, during the etching processes, especially the anisotropic etching process, a portion of the protection layer 13 may be consumed. In one embodiment, a portion of the protection layer 13 on the top surfaces of the sidewalls 12 and the gate structures 113 may be consumed up after the etching processes.

Figure 6:
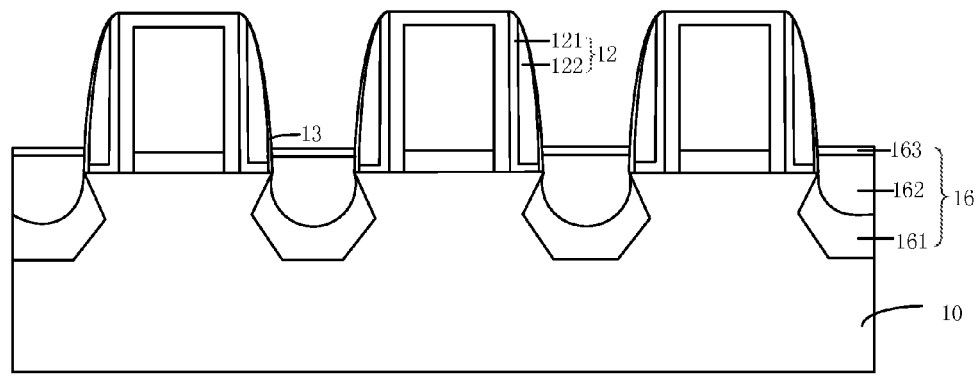

Returning to FIG. 11, after forming the sigma trenches 15, SiGe structures may be formed in the sigma trenches 15 (S4). FIG. 6 illustrates a corresponding semiconductor structure.

As shown in FIG. 6, SiGe structures 16 are formed in the sigma trenches 15; and top surfaces of the SiGe structures 16 are higher the surface 101 of the semiconductor substrate 10. Thus, an amount of SiGe material filled in the trenches 15 may be greater than SiGe structures with a surface leveling with the surface 101 of the semiconductor substrate 10 and the performance of PMOS transistors having the SiGe structures 16 may be improved.

Various processes may be used to form the SiGe structures 16 in the sigma trenches 15, such as a CVD process, a PVD process, an FCVD process, or a molecular beam epitaxy (MBE) process, or a vapor phase epitaxy (VPE) process, etc. In one embodiment, the SiGe structures 16 are formed by a CVD process. In order to generate an enough compressive stress to the channel region of a PMOS transistor, when to stop the CVD process may need to be considered. As shown in FIG. 6, in one embodiment, when the surface of surface of the SiGe structures 16 is higher than the surface 101 of the semiconductor substrate 10 with a pre-determined value, the CVD process for forming the SiGe structures 16 may be stopped. Thus, an amount of SiGe material filled into the sigma trenches 15 may be increased.

The SiGe structures 16 may be a single layer. The SiGe structures 16 may also be a multiple-layer structure. In one embodiment, as shown in FIG. 6, the SiGe structure 16 is a multiple-layer structure including a first SiGe layer 161, a second SiGe layer 162 and a third SiGe layer 163.

A concentration of Ge in the first SiGe layer 161 may be relatively low. A low Ge concentration in the first SiGe layer 161 may prevent a significantly big crystal mismatch between the substrate 10 and the subsequently formed second SiGe layer 162 which may have a relatively high Ge concentration. A big crystal mismatch may cause the second SiGe layer 162 to have an undesired quality. That is, the first SiGe layer 161 may be used as a buffer layer for growing the second SiGe layer 162.

In one embodiment, if $Si_{1-x}Ge_x$ is used to refer a formula of the SiGe material in the first SiGe layer 161, 'x' may be in a range of approximately 5%~30%. That is, a Ge atomic percentile of the first SiGe layer 161 may be in a range of approximately 5%~30%.

One purpose of forming the second SiGe layer 162 may be to apply a compressive stress to the sigma trenches 15 and all sides of the semiconductor substrate 10. That is, the second SiGe layer 162 may be a main portion of the SiGe structures 16 to generate the compressive stress. Thus, the second SiGe layer 162 may be referred as a filling layer.

In one embodiment, if $Si_{1-y}Ge_y$ is used to refer a formula of the SiGe material in the second SiGe layer 162, 'y' may be in a range of approximately 20%~60%. That is, a Ge atomic percentile of the second SiGe layer 162 may be in a range of approximately 20%~60%. In one embodiment, 'y' may be in a range of approximately 40%~60%. That is, a Ge atomic percentile of the second SiGe layer 162 may be in a range of approximately 40%~60%.

After forming the first SiGe layer 161 and the second SiGe layer 162, a P-type ion implantation process may be performed onto the first SiGe layer 161 and the second SiGe layer 162 for subsequently forming a source region and a drain region. The first SiGe layer 161 and the second SiGe layer 162 may also be in situ doped. That is, the P-type ions may be in situ introduced into the first SiGe layer 161 and the second SiGe layer 162 when the first SiGe layer 161 and the second SiGe layer 162 are being formed.

In order to reduce a contact resistance between the source region and contact vias of subsequently formed interconnection structures and a contact resistance between the drain region and contact vias of subsequently formed interconnection structures, the third SiGe layer 163 may be formed on the second SiGe layer 162. The third SiGe layer 163 may be used to form a metal silicide to reduce the contact resistance between the source region and the contact vias and the contact resistance between the drain region and the contact vias. Thus, the third SiGe layer 163 may also be referred as a second capping layer 163.

In one embodiment, if $Si_{1-z}Ge_z$ is used to refer a formula of the SiGe material in the third SiGe layer 163, 'z' may be smaller than approximately 30%. That is, a Ge atomic percentile of the third SiGe layer 163 may be less than approximately 30%. In one embodiment, the capping layer 163 may be pure silicon.

Returning to FIG. 11, after forming the SiGe structures 16 in the sigma shape trenches 15, lightly doped regions may be formed in the semiconductor substrate 10 (S5). FIGS. 7~10 illustrate semiconductor structures corresponding to a process for forming the lightly doped regions.

Figure 7:
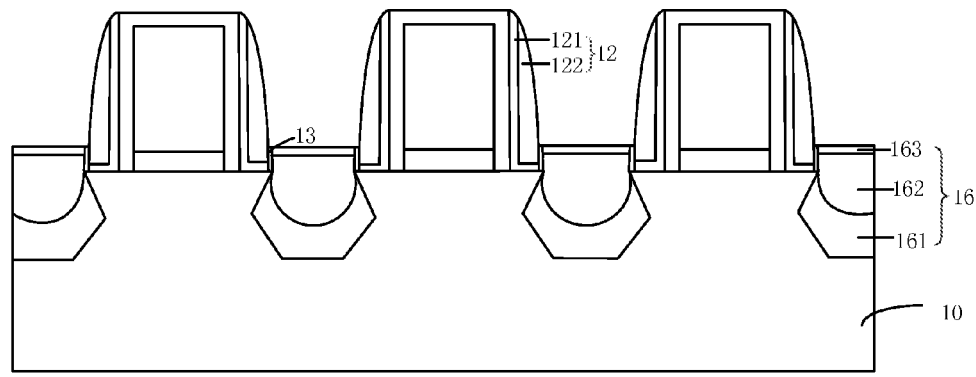
Figure 8:
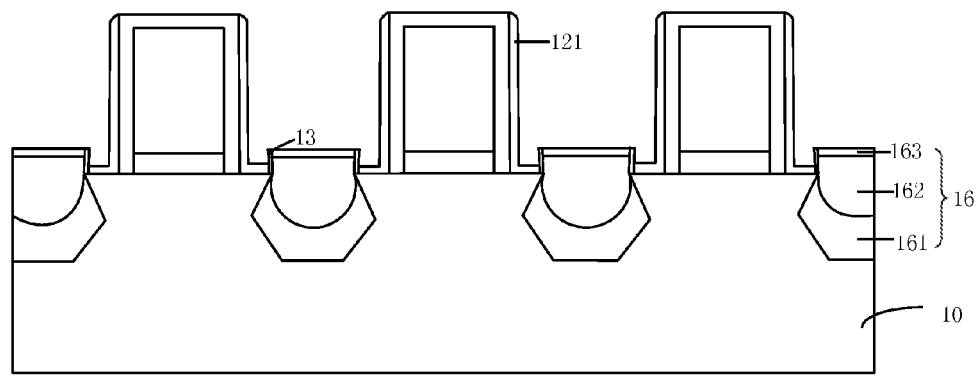

As shown in FIGS. 7~8, the process may include removing a portion of protection layer 13 above the third SiGe layer 163; and removing the SiN layer 122 of the sidewalls spacer 12. Various processes may be used to remove the portion of the protection layer 13 and the SiN layer 122 of the sidewall spacer 12, such as a dry etching process, a wet etching process, or an ion beam etching process, etc. In one embodiment, a wet etching process may be used.

An etching solution of the wet etching process may include any appropriate chemical. In one embodiment, the etching solution is a hot phosphoric acid. The hot phosphoric solution may etch the SiN layer 122. The hot phosphoric acid may also etch the protection layer 13. As shown in FIG. 7, a portion of the protection layer 13 above the third SiGe layer 163 may be removed firstly. Then, as shown in FIG. 8, the SiN layer 122 of the sidewall spacer 12 may be completely removed.

By properly selecting a material for the protection layer 13, the hot phosphoric acid may have an etching selectivity to the protection layer 13 and the SiN layer 122. In one embodiment, an etching rate of the hot phosphoric acid to the protection layer 13 may be lower than an etching rate of the hot phosphoric acid to the SiN layer 122, thus only the portion of the protection layer 13 above the third SiGe layer 163 may be removed. As shown in FIG. 8, the left portion of the protection layer 13 may still protect side surfaces of portions of the second SiGe layer 162 protruding from the surface 101 of the semiconductor substrate 10 after removing the SiN layer 122 using the hot phosphoric acid.

In one embodiment, the protection layer 13 may be made of carbon-doped silicon nitride, or oxygen-doped silicon nitride. Other appropriate material may also be used as the protection layer 13 to obtain such an etching selectivity.

In one embodiment, a temperature of the hot phosphoric acid may be in a range of approximately 100° C.~180° C. A good etching selectivity may be obtained when such a temperature is used.

Further, as shown in FIG. 9, after removing the SiN layer 122 of the sidewall spacer 12, the $SiO_2$ layer 121 of the sidewall spacer 12 may be removed; and the surface 101 of the semiconductor substrate 100 may be exposed. Various processes may be used to remove the $SiO_2$ 121, such as a dry etching process, a wet etching process, or an ion bean etching process, etc. In one embodiment, the $SiO_2$ layer 121 may be removed by a wet etching process.

An etching solution of the wet etching process may include any appropriate chemical. In one embodiment, the etching solution is a diluted hydrogen fluoride (HF) solution. The diluted HF solution may be used to completely remove the $SiO_2$ 121 of the sidewall spacer 12. An etching rate of the diluted HF solution to the protection layer 13 may be lower than an etching rate of the diluted HF solution to the SiN layer 122, thus, as shown in FIG. 9, the left protection layer 13 may not be etched or overly etched by the HF solution after removing the $SiO_2$ layer 121 of the sidewall spacer 12.

When the protection layer 13 is made of carbon-doped silicon nitride, or oxygen-doped silicon nitride, such an etching selectivity may be obtained. Other appropriate material may also be used as the protection layer 13 to obtain such an etching selectivity.

Further, as shown in FIG. 10, after removing the sidewall spacers 12, lightly doped drain (LDD) regions 17 may be formed in the semiconductors substrate 10 at both sides of the gate structures 11 by an ion implantation process.

In one embodiment, other semiconductor devices and structures may also be formed on the semiconductor structure 10 with PMOS transistors. Thus, before forming the LDD regions 17 of the PMOS transistors, regions for forming the other semiconductor devices and structures may be covered by a photoresist layer (not shown) to protect the other semiconductor devices and structures from being damaged by the ion implantation process.

Referring to FIG. 10, the ion implantation process may be performed on a portion of the surface 101 of the semiconductor substrate 10 exposed by the sidewall spacers 12. The LDD regions 17 may include LDD drain structures and LDD source structures, etc.

Various types of ions may be used for the ion implantation process, such B ions, etc. A dose of the B ions in the ion implantation process may be in a range of approximately 1E13 atom/cm$^2$~5E15 atom/cm$^2$.

Further, referring to FIG. 10, the capping layer 113 of the gate structure 11 may protect the gate electrode 112 and the gate dielectric layer 111 during the ion implantation process for forming the LDD regions 17. The LDD regions 17 may be defined after defining the source region and the drain region (the process for forming the embedded SiGe structures 16), defects of the LDD regions 17 may prevented, and a leakage current may be reduced.

Returning to FIG. 11, after forming the LDD regions 17, a cleaning process may be performed to clean the semiconductor substrate 10 to remove residue photoresist; thus PMOS transistors may be formed.

Various processes may be used to remove the residue photoresist on the semiconductor substrate 10, such as a plasma ashing process, or a wet chemical cleaning process, etc. In one embodiment, the residue photoresist is removed by a wet chemical cleaning process.

A cleaning solution may include any appropriate chemical. In one embodiment, the cleaning solution includes ammonia, hydrogen peroxide and water. Referring to FIG. 10, the cleaning solution may have a low etching rate to the protection layer 13 than the SiGe structures 16, thus side surfaces of the SiGe structures 16 protruding from the surface 101 of the substrate 10 may be protected by the left portion of the protection layer 13. In order to protect the SiGe structures 16 protruding from the surface 101 of the substrate 10, the left portion of the protection layer 13 may have a pre-determined thickness. In one embodiment, the thickness of the left portion of the protection layer 13 may be in a range of approximately 5 Å~200 Å.

Further, when the third SiGe layer 163 is made of pure silicon, i.e. a single silicon capping layer, the cleaning solution may have a substantially small etching rate to silicon, thus, referring to FIG. 10, the cleaning solution may be unable to etch the SiGe structures 16 from the top of the SiGe structures 16.

Thus, a PMOS transistor may be formed by the above disclosed processes and methods; and the corresponding PMOS transistor is illustrated in FIG. 10. The PMOS transistor includes a semiconductor substrate 10; and sigma shape SiGe structures 16 with a top surface protruding from a surface 101 of the semiconductor substrate 10 formed in the semiconductor substrate 10 and configured as a source region and a drain region of the PMOS transistor. The PMOS transistor also includes a gate structure 11 having a gate dielectric layer 111, a gate electrode layer 112 and a capping layer 113 on the semiconductor substrate 10; and lightly doped drain regions 17 at both sides of the gate structure 11. Further, the PMOS transistor includes a protection layer 13 covering side surfaces of the SiGe structures 16 protruding from the surface 101 of the semiconductor substrate 10. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a PMOS transistor, comprising:
   providing a semiconductor substrate;
   forming gate structures on a surface of the semiconductor substrate;
   forming sidewall spacers around the gate structures;
   forming a protection layer on the sidewall spacers;
   forming sigma shape trenches in the semiconductor substrate at sides of the gate structures;
   forming SiGe structures with a surface protruding from the surface of the semiconductor substrate in the sigma shape trenches;
   removing the sidewall spacers and a portion of the protection layer; and
   forming lightly doped drain regions in the semiconductor substrate at both sides of the gate structures.

2. The method according to claim 1, wherein forming gate structure on a surface of the semiconductor substrate further includes:
   forming a gate dielectric material layer on the surface of the semiconductor substrate;
   forming a gate electrode material layer on the gate dielectric material layer;
   forming a patterned photoresist layer on the gate electrode material layer; and
   etching the gate electrode material layer and the gate dielectric layer using the patterned photoresist layer as an etching mask.

3. The method according to claim 1, wherein:
   a remaining portion of the protection layer protects side surfaces of portions of the SiGe structure protruding from the surface of the semiconductor substrate.

4. The method according to claim 1, after forming the gate structures further including:
   forming a capping layer on the gate structure.

5. The method according to claim 1, after forming the lightly doped drain regions, further including:
   cleaning the semiconductor substrate to remove residue photoresist.

6. The method according to claim 1, wherein:
   the sidewall spacer includes a silicon oxide layer on the gate structures and a silicon nitride layer on the silicon oxide layer.

7. The method according to claim 6, wherein removing the sidewall spacers further includes:
   removing the silicon nitride layer and the portion of the protection layer; and
   removing the silicon oxide layer.

8. The method according to claim 1, before forming the lightly doped drain regions, further including:
   covering other semiconductor devices and structures in other regions of the semiconductor substrate using a photoresist layer.

9. The method according to claim 1, wherein forming the SiGe structures further includes:
   forming a first SiGe layer on side surfaces and bottom surfaces of the sigma shape trenches;
   forming a second SiGe layer with a Ge atomic concentration higher than the first SiGe layer on the first SiGe layer; and
   forming a third SiGe layer with a Ge atomic concentration lower than the first SiGe layer.

10. The method according to claim 1, wherein forming the sigma shape trenches further includes:
   forming bowl shape trenches in the semiconductor substrate; and
   etching the bowl shape trenches to form the sigma shape trenches.

11. The method according to claim 1, wherein:
   the SiGe structures are formed by a molecular beam epitaxy process, or a vapor phase epitaxy process.

12. The method according to claim 1, wherein
   the protection layer is made of carbon-doped silicon nitride;
   a carbon concentration of the carbon-doped silicon nitride is in a range of 0.5%~5%;
   the carbon-doped silicon nitride layer is formed by a conventional chemical vapor deposition process in a furnace, a physical vapor deposition process, or an atomic layer deposition process; and
   a thickness of the protection layer is in a range of approximately 5 Å~200 Å.

13. The method according to claim 7, wherein:
   the silicon nitride layer is removed by a hot phosphoric acid solution; and
   the silicon oxide layer is removed by a diluted hydrogen fluoride solution.

14. The method according to claim 13, wherein:
   a temperature of the hot phosphoric acid solution is in a range of approximately 100° C.~180° C.; and
   a time for using the hot phosphoric acid to remove the silicon nitride layer is in a range of approximately 5 min~100 min.

15. The method according to claim 5, wherein:
   a cleaning solution for removing the residue photoresist layer is a mixture of ammonia, hydrogen peroxide and water.

16. A PMOS transistor, comprising:
   a semiconductor substrate;
   a gate structure formed on a surface of the semiconductor substrate;
   SiGe structures with a surface protruding from the surface of the semiconductor substrate formed in the semiconductor substrate at both sides of the gate structure;
   lightly doped drain regions formed in the semiconductor substrate at both sides of the gate structure; and
   a protection layer protecting side surfaces of portions of the SiGe structures protruding from the surface of the semiconductor substrate,
   wherein the SiGe structures with a surface protruding from the surface of the semiconductor substrate is formed by:
      forming sigma shape trenches in the semiconductor substrate at both sides of the gate structure; and
      forming the SiGe structures with a surface protruding from the surface of the semiconductor substrate in the trenches.

17. The PMOS transistor according to claim 16, wherein:
   the protection layer is made of carbon-doped silicon nitride.

18. The PMOS transistor according to claim 16, wherein:
   a capping layer is formed to cover the gate structures.

19. The PMOS transistor according to claim 16, wherein:
   each of the SiGe structures has a first SiGe layer formed on surfaces of the sigma shape trench, a second SiGe layer formed on the first SiGe layer and a third SiGe layer formed on the second SiGe layer.

20. The semiconductor structure according to claim 19, wherein:
   a Ge atomic percentile of the first SiGe layer is in a range of approximately 5%~30%;
   a Ge atomic percentile of the second SiGe layer is in a range of approximately 20%~60%; and
   a Ge atomic percentile of the third SiGe layer is less than approximately 30%.

* * * * *